United States Patent
Lee (10) Patent No.: US 8,593,886 B2
(45) Date of Patent: Nov. 26, 2013

(54) SEMICONDUCTOR SYSTEM INCLUDING SEMICONDUCTOR DEVICE

(75) Inventor: Jeong Hun Lee, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 148 days.

(21) Appl. No.: 13/339,050

(22) Filed: Dec. 28, 2011

(65) Prior Publication Data

US 2013/0107641 A1     May 2, 2013

(30) Foreign Application Priority Data

Oct. 28, 2011   (KR) .................. 10-2011-0111331

(51) Int. Cl.
  *G11C 7/00* (2006.01)
  *G11C 8/00* (2006.01)

(52) U.S. Cl.
  USPC ............ 365/189.05; 365/189.09; 365/189.17; 365/230.06

(58) Field of Classification Search
  USPC .............. 365/189.05, 189.09, 189.17, 230.06
  See application file for complete search history.

(56) References Cited

U.S. PATENT DOCUMENTS

| | | | | |
|---|---|---|---|---|
| 6,958,947 | B2 * | 10/2005 | Park et al. ................. | 365/189.09 |
| 7,394,706 | B2 * | 7/2008 | Horiguchi et al. ........ | 365/189.09 |
| 7,460,427 | B2 * | 12/2008 | Kawakami et al. ...... | 365/189.09 |
| 7,990,778 | B2 * | 8/2011 | Oku .......................... | 365/189.09 |
| 8,416,634 | B2 * | 4/2013 | Kim .......................... | 365/189.09 |
| 2010/0110802 | A1 | 5/2010 | Momma | |

FOREIGN PATENT DOCUMENTS

| KR | 10-0897274 | | 5/2009 |
|---|---|---|---|
| KR | 10-0926621 | B1 | 11/2009 |

* cited by examiner

*Primary Examiner* — Trong Phan
(74) *Attorney, Agent, or Firm* — William Park & Associates Patent Ltd.

(57) ABSTRACT

A semiconductor system includes a controller configured to apply code signals for setting levels of a reference voltage and data, and to receive output data. The semiconductor system also includes a semiconductor device configured to receive the data for the respective levels of the reference voltage set according to the code signals, to compare the reference voltages with the data to generate new data, to store the new data as internal data, and to process the stored internal data to output as the output data.

25 Claims, 10 Drawing Sheets

SEMICONDUCTOR SYSTEM INCLUDING SEMICONDUCTOR DEVICE

CROSS-REFERENCES TO RELATED APPLICATIONS

The present application claims priority under 35 U.S.C. 119(a) to Korean Application No. 10-2011-0111331 filed on Oct. 28, 2011 in the Korean Intellectual Property Office, which is incorporated by reference in its entirety.

BACKGROUND

A semiconductor device uses various reference voltages to discriminate the logic levels of internal signals. Since these reference voltages serve as absolute voltages for discriminating the logic levels of the data and the internal signals, it is important to check level ranges for allowing the data and the internal signals to be received without errors.

Recently, reference voltage training is being used where it is capable of setting the levels of a reference voltage by finding the level range of the reference voltage for allowing a normal operation. The reference voltage training is implemented such that the levels of a reference voltage are set according to the combinations of code signals preset in a mode register set (MRS) and write and read operations are performed according to the reference voltage set by the reference voltage training. The term "combination" refers to a numeric value associated with signals or data. For example, if the code signals comprise two signals, each signal may be at a logic low level ('0') or a logic high level ('1'), and there are four combinations of the two signals corresponding to numeric values of zero ('00'), one ('01'), two ('10'), and three ('11'). Accordingly, when code signals in the reference voltage training have n bits, the reference voltage is set to $2^n$ number of different levels, and the write and read operations are performed $2^n$ times.

Therefore, in the conventional reference voltage training, the write and read operations should be performed by the number of combinations of the code signals. Consequently, as the number of bits increases, time and amount of current required for the reference voltage training increase in a geometrical progression.

SUMMARY

An embodiment of the present invention relates to a semiconductor system including a semiconductor device, in which, after storing all the data inputted in response to reference voltages set for respective combinations of code signals, the stored data are simultaneously outputted through one read operation, so that a time required for reference voltage training can be shortened and current consumption can be reduced.

In one embodiment, a semiconductor system includes a controller configured to apply code signals for setting levels of a reference voltage and data, and to receive output data. The semiconductor system also includes a semiconductor device configured to receive the data for the respective levels of the reference voltage set according to the code signals, to store the data as internal data, and to output the stored data as the output data.

In another embodiment, a semiconductor system includes a controller configured to apply code signals for setting levels of a reference voltage, data, a read command and a write command, and receive output data; and the semiconductor device configured to receive, in response to the write command, the data for the respective levels of the reference voltage set according to the code signals, store the data as internal data, and output stored internal data as the output data in response to the read command.

In another embodiment, a semiconductor device includes a reference voltage generation unit configured to generate a reference voltage with a first level in response to code signals with a first combination, and generate a reference voltage with a second level in response to code signals with a second combination; an internal data generation unit configured to receive data and the reference voltage and generate internal data; a control signal generation unit configured to assert a write signal when the code signals are the first combination, and sequentially assert the write signal and a read signal when the code signals are the second combination; and a storage unit configured to store the internal data in response to the write signal.

In another embodiment, a semiconductor device includes a reference voltage generation unit configured to generate a reference voltage with a first level in response to code signals with a first combination, and generate a reference voltage with a second level in response to code signals with a second combination; an internal data generation unit configured to receive data and the reference voltage and generate internal data; a control signal generation unit configured to assert a write signal when a write command is inputted; and a storage unit configured to store the internal data in response to the write signal.

The above-described embodiments of the present invention describe storing all the data inputted in response to reference voltages set for respective combinations of code signals, then outputting the stored data simultaneously through one read operation. As a consequence, time required for reference voltage training can be shortened and current consumption can be reduced.

Also, according to the embodiments of the present invention, a boot time may be shortened since the test time is shortened.

BRIEF DESCRIPTION OF THE DRAWINGS

The above and other aspects, features, and advantages will be more clearly understood from the following detailed description taken in conjunction with the accompanying drawings.

DESCRIPTION OF SPECIFIC EMBODIMENTS

Various embodiments of the present invention will be described with reference to accompanying drawings. However, the embodiments are for illustrative purposes only and are not intended to limit the scope of the invention.

Figure 1:
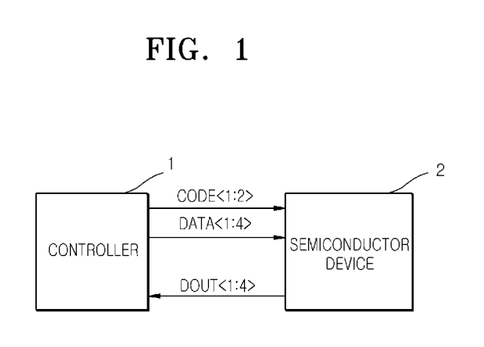
FIG. 1 is a block diagram showing an configuration of a semiconductor system in accordance with an embodiment of the present invention.

FIG. 1 is a block diagram showing the configuration of a semiconductor system in accordance with an embodiment of the present invention.

Referring to FIG. 1, the semiconductor system in accordance with an embodiment of the invention includes a controller 1 configured to apply code signals CODE<1:2> for setting the levels of a reference voltage and data DATA<1:4> and receive output data DOUT<1:4>, and a semiconductor device 2 configured to receive and store the data DATA<1:4> for the respective levels of the reference voltage set according to the code signals CODE<1:2>, compress the stored data and output the output data DOUT<1:4>. The controller 1 initially applies the code signals CODE<1:2> initialized to a combination of '00' to the semiconductor device 2, and then applies the code signals CODE<1:2> to the semiconductor device 2 by incrementing the code signals CODE<1:2> by one until the code signals CODE<1:2> become a combination of '11'. In the controller 1, the code signals CODE<1:2> are incremented in the sequence of '00', '01', '10' and '11'. The controller 1 receives the output data DOUT<1:4> when the code signals CODE<1:2> have the combination of '11'. The configuration of the semiconductor device 2 will be described in detail with reference to FIG. 2.

Figure 2:
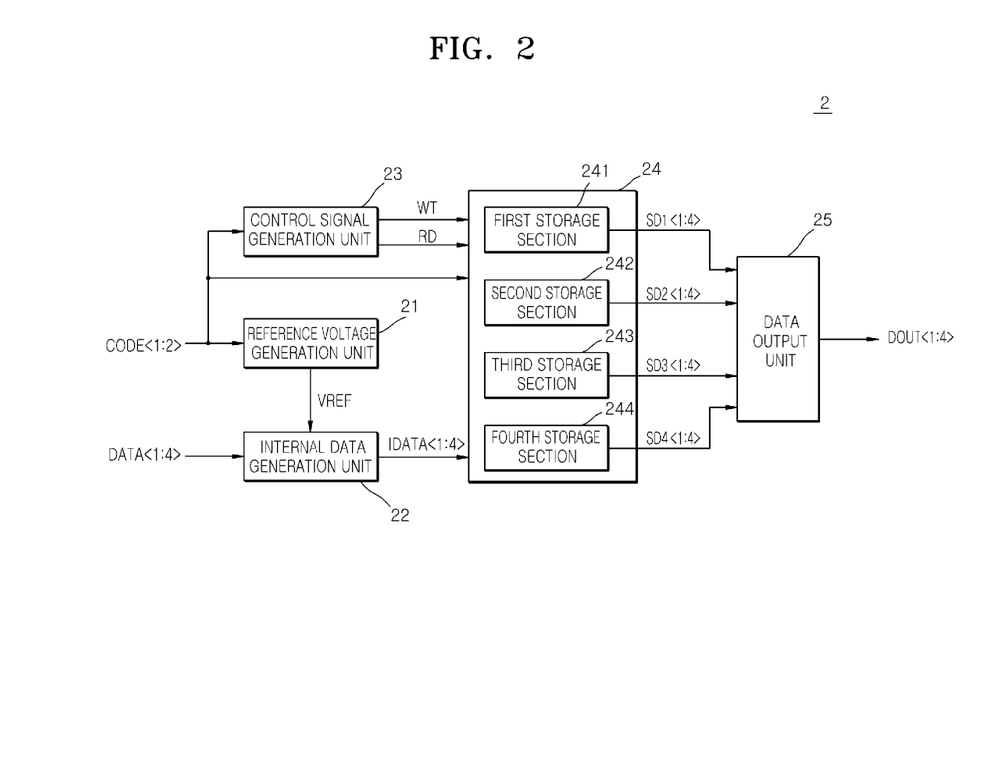
FIG. 2 is a block diagram showing an configuration of the semiconductor device in the semiconductor system shown in FIG. 1.

Referring to FIG. 2, the semiconductor device 2 includes a reference voltage generation unit 21, an internal data generation unit 22, a control signal generation unit 23, a storage unit 24, and a data output unit 25. The storage unit 24 includes a first storage section 241, a second storage section 242, a third storage section 243, and a fourth storage section 244.

The reference voltage generation unit 21 is configured to generate a reference voltage VREF which has a level set according to a combination of the code signals CODE<1:2>. In detail, the reference voltage VREF generated by the reference voltage generation unit 21 has a first level when the code signals CODE<1:2> have the combination of '00', a second level when the code signals CODE<1:2> have the combination of '01', a third level when the code signals CODE<1:2> have the combination of '10', and a fourth level when the code signals CODE<1:2> have the combination of '11'. The detailed configuration of the reference voltage generation unit 21 will be described later with reference to FIG. 3.

The internal data generation unit 22 is configured to compare the reference voltage VREF and the data DATA<1:4> for the respective levels of the reference voltage VREF and generate internal data IDATA<1:4>. The internal data generation unit 22 may be realized by a plurality of comparators which compare the reference voltage VREF with respective bits of the data DATA<1:4> and output the internal data IDATA<1:4>. If the level of the reference voltage VREF is within a level range allowing a normal operation, the internal data IDATA<1:4> generated by the internal data generation unit 22 are generated to be the same as the data DATA<1:4>.

The control signal generation unit 23 is configured to generate a write signal WT which is asserted and a read signal RD which is deasserted when the code signals CODE<1:2> have the combinations of '00', '01' and '10'. Further, the control signal generation unit 23 is configured to generate the write signal WT and the read signal RD which are sequentially asserted when the code signals CODE<1:2> have the combination of '11'.

The storage unit 24 is configured to sequentially store the internal data IDATA<1:4> to the first to fourth storage sections 241 to 244 in response to the combinations of the code signals CODE<1:2> when the write signal WT is enabled. In detail, the internal data IDATA<1:4> generated when the reference voltage VREF has the first level are stored in the first storage section 241, the internal data IDATA<1:4> generated when the reference voltage VREF has the second level are stored in the second storage section 242, the internal data IDATA<1:4> generated when the reference voltage VREF has the third level are stored in the third storage section 243, and the internal data IDATA<1:4> generated when the reference voltage VREF has the fourth level are stored in the fourth storage section 244.

When the read signal RD is asserted, the storage unit 24 outputs the data stored in the first storage section 241 as first storage data SD1<1:4>, the data stored in the second storage section 242 as second storage data SD2<1:4>, the data stored in the third storage section 243 as third storage data SD3<1:4>, and the data stored in the fourth storage section 244 as fourth storage data SD4<1:4>. The first storage section 241, the second storage section 242, the third storage section 243 and the fourth storage section 244 may be realized by storage circuits such as memory cells or registers generally known in the art.

The data output unit 25 is configured to compress the respective first storage data SD1<1:4>, the second storage data SD2<1:4>, the third storage data SD3<1:4>, and the fourth storage data SD4<1:4>, and generate the output data DOUT<1:4>. The respective bits included in the output data DOUT<1:4> outputted from the data output unit 25 include information as to whether the levels of the reference voltage VREF set by the combinations of the code signals CODE<1:2> are within the level range allowing the normal operation. For example, the output data DOUT<1> is generated as a logic high level when the first storage data SD1<1:4> have the same level as the data DATA<1:4>, meaning that the first level of the reference voltage VREF is within the level range allowing the normal operation. The detailed configuration of the data output unit 25 will be described later with reference to FIGS. 4 and 5.

Figure 3:
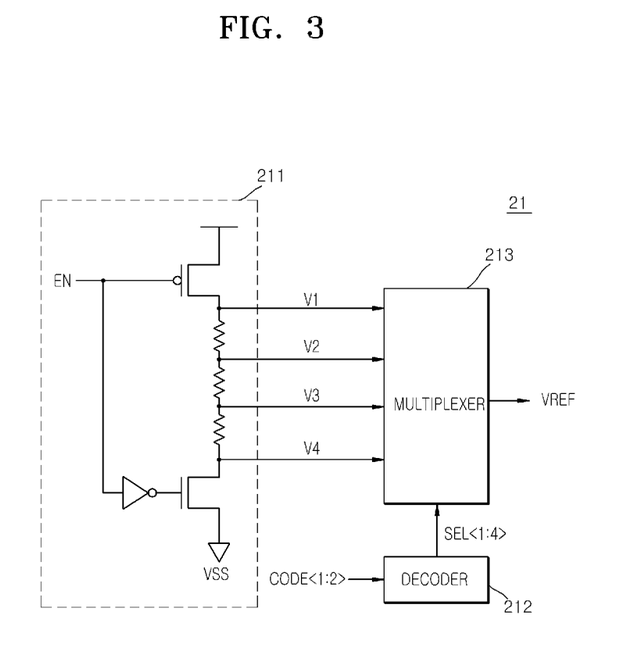
FIG. 3 is a view showing an configuration of the reference voltage generation unit included in the semiconductor device shown in FIG. 2.

Referring to FIG. 3, the reference voltage generation unit 21 includes a voltage dividing section 211 configured to perform a voltage dividing operation according to an enable signal EN and generate first to fourth voltages V1 to V4 respectively having first to fourth levels, a decoder 212 configured to decode the code signals CODE<1:2> and generate first to fourth select signals SEL<1:4> which are selectively asserted, and a multiplexer 213 configured to selectively output the first to fourth voltages V1 to V4 as the reference voltage VREF in response to the first to fourth select signals SEL<1:4>.

The reference voltage VREF generated by the reference voltage generation unit 21 configured in this way has the first level by the first select signal SEL<1> asserted when the code signals CODE<1:2> have the combination of '00', the second level by the second select signal SEL<2> asserted when the code signals CODE<1:2> have the combination of '01', the third level by the third select signal SEL<3> asserted when the code signals CODE<1:2> have the combination of '10', and the fourth level by the fourth select signal SEL<4> asserted when the code signals CODE<1:2> have the combination of '11'.

Figure 4:
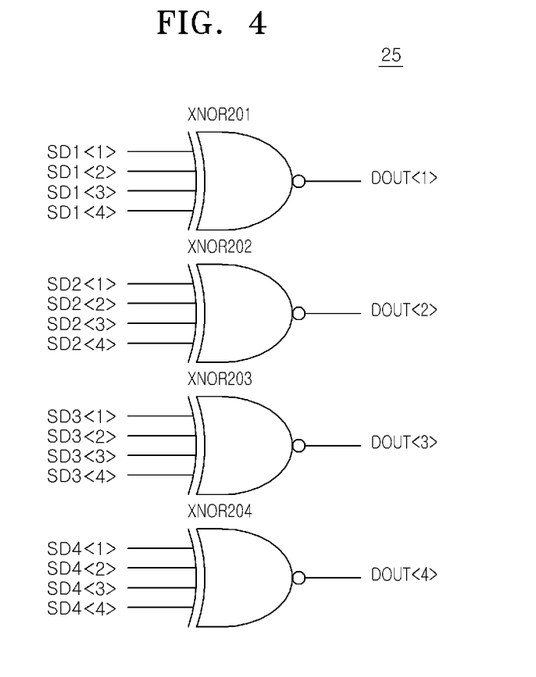
FIG. 4 is a view showing an embodiment of the data output unit included in the semiconductor device shown in FIG. 2.

Referring to FIG. 4, the data output unit 25 includes logic elements XNOR201 to XNOR204 which perform exclusive NOR operations. The data output unit 25 configured in this way is used when all the bits of the data DATA<1:4> are inputted as the same logic level. That is to say, in the case where all the data DATA<1:4> have a logic high level and all the levels of the reference voltage are within the level range allowing the normal operation, all the bits of the first storage data SD1<1:4>, second storage data SD2<1:4>, third storage data SD3<1:4> and fourth storage data SD4<1:4> are generated as logic high levels, and all the bits of the output data DOUT<1:4> are generated as logic high levels. If the first level of the reference voltage VREF is not within the level range allowing the normal operation, all the bits of the first storage data SD1<1:4> are not generated as the logic high level, and the output data DOUT<1> is generated as a logic low level.

Figure 5:
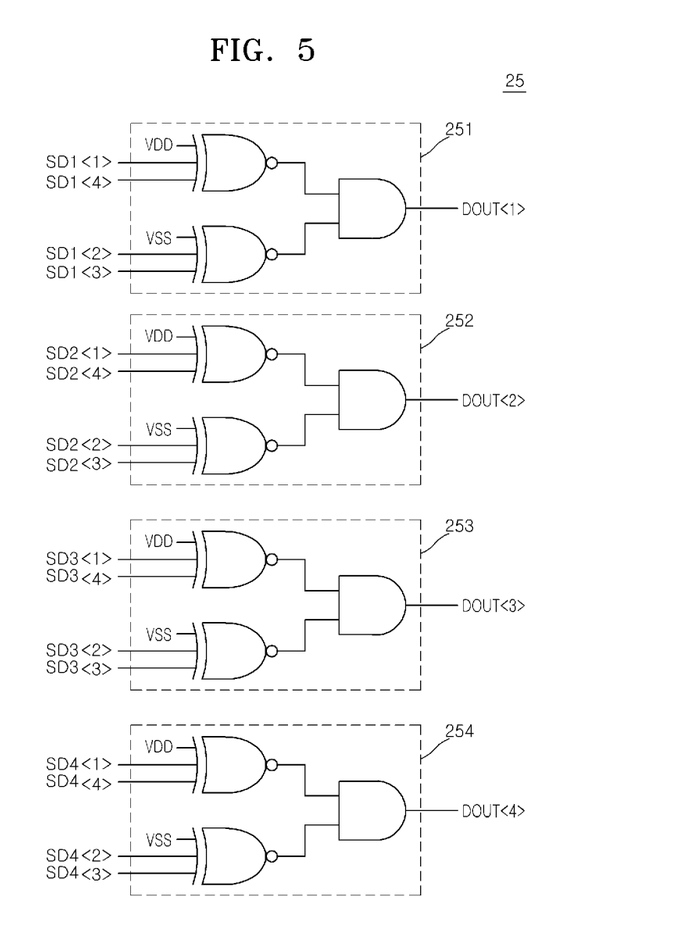
FIG. 5 is a view showing another embodiment of the data output unit included in the semiconductor device shown in FIG. 2.

Referring to FIG. 5, the data output unit 25 includes first to fourth output data generating sections 251 to 254 configured to generate the output data DOUT<1:4>. The data output unit 25 configured in this way is used in the case where the data DATA<1:4> are inputted as a logic low level, a logic high level, a logic high level and a logic low level.

Figure 6:
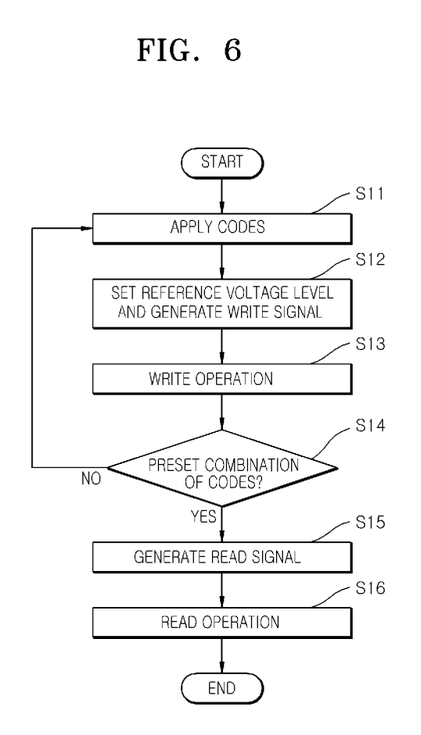
FIG. 6 is a flow chart explaining a reference voltage training process conducted by the semiconductor system shown in FIG. 1.

A reference training operation conducted in the semiconductor system configured as mentioned above will be described below with reference to FIG. 6.

First, the semiconductor device 2 is applied with the code signals CODE<1:2> which are initialized to the combination of '00' in the controller 1 (S11). The combination of '00' generates the reference voltage VREF to the first level and asserts the write signal WT (S12) so that the internal data IDATA<1:4> generated by the reference voltage VREF with the first level is stored to the first storage section 241 (S13).

Next, since the code signals CODE<1:2> has not reached '11' (S14), the controller 1 increments the code signals CODE<1:2> by one to generate the combination of '01' and applies the resultant code signals CODE<1:2> to the semiconductor device 2, and the steps S11 to S14 described above are repeated. Accordingly, through these steps, the internal data IDATA<1:4> generated by the reference voltage VREF of the second level are stored in the second storage section 242, the internal data IDATA<1:4> generated by the reference voltage VREF of the third level are stored in the third storage section 243, and the internal data IDATA<1:4> generated by the reference voltage VREF of the fourth level are stored in the fourth storage section 244.

When the code signals CODE<1:2> have the combination of '11', the read signal RD is asserted (S15), and the read operation is performed (S16). The data stored in the first to fourth storage sections 241 to 244 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 1 receives the output data DOUT<1:4>, checks the level range of the reference voltage VREF allowing the normal operation, and sets the level of the reference voltage VREF. In other words, in the case where only the output data DOUT<4> among the output data DOUT<1:4> has a logic low level, the levels of the reference voltage VREF allowing the normal operation become the first level, the second level and the third level. Thus, the controller 1 sets the level of the reference voltage VREF to one of the first level, the second level, and the third level.

In the semiconductor system in accordance with an embodiment of the invention, after storing all the data inputted in response to reference voltages set for respective combinations of code signals, the stored data are simultaneously outputted through one read operation. As a consequence, a time required for reference voltage training can be shortened and current consumption can be reduced.

Figure 7:
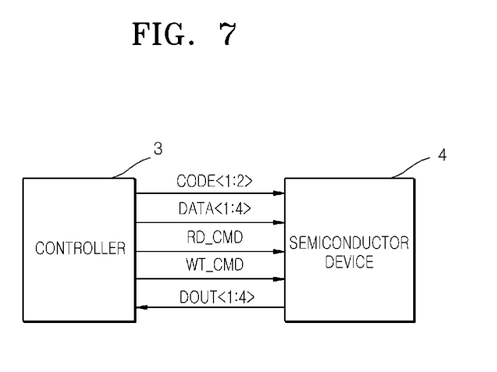
FIG. 7 is a block diagram showing an configuration of a semiconductor system in accordance with another embodiment of the present invention.

FIG. 7 is a block diagram showing the configuration of a semiconductor system in accordance with another embodiment of the present invention.

Referring to FIG. 7, the semiconductor system in accordance with an embodiment of the invention includes a controller 3 configured to apply code signals CODE<1:2> for setting the levels of a reference voltage, data DATA<1:4>, a read command RD_CMD, and a write command WT_CMD. The controller 3 may also be configured to receive output data DOUT<1:4> from a semiconductor device 4, and the semiconductor device 4 may be configured to receive and store the data DATA<1:4> for the respective levels of the reference voltage set according to the code signals CODE<1:2>, compress the stored data and output the output data DOUT<1:4>. The controller 3 initially applies the code signals CODE<1:2> initialized to a combination of '00' to the semiconductor device 4, and then applies the code signals CODE<1:2> to the semiconductor device 4 by incrementing the code signals CODE<1:2> by one until the code signals CODE<1:2> become a combination of '11'. In the controller 3, the code signals CODE<1:2> are incremented by one to generate the sequence of '00', '01', '10' and '11'. Also, the controller 3 receives the output data DOUT<1:4> when the code signals CODE<1:2> have the combination of '11'. The configuration of the semiconductor device 4 will be described in detail with reference to FIG. 8.

Figure 8:
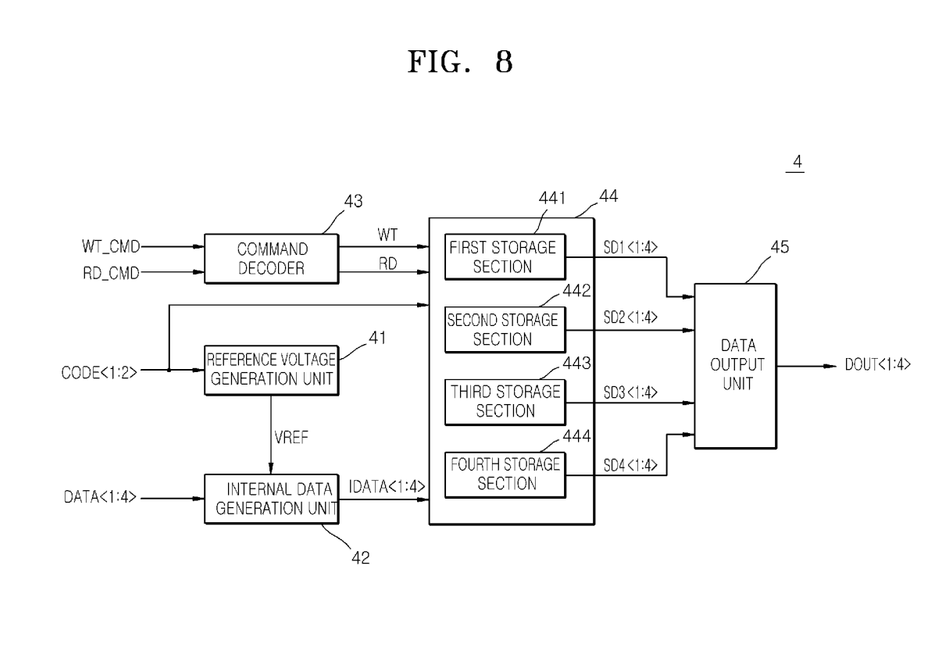
FIG. 8 is a block diagram showing an configuration of the semiconductor device included in the semiconductor system shown in FIG. 7.

Referring to FIG. 8, the semiconductor device 4 includes a reference voltage generation unit 41, an internal data generation unit 42, a command decoder 43, a storage unit 44, and a data output unit 45. The storage unit 44 includes a first storage section 441, a second storage section 442, a third storage section 443, and a fourth storage section 444.

The reference voltage generation unit 41 is configured to generate a reference voltage VREF which has a level set according to a combination of the code signals CODE<1:2>. In detail, the reference voltage VREF generated by the reference voltage generation unit 41 has a first level when the code signals CODE<1:2> have the combination of '00', a second level when the code signals CODE<1:2> have the combination of '01', a third level when the code signals CODE<1:2> have the combination of '10', and a fourth level when the code signals CODE<1:2> have the combination of '11'.

The internal data generation unit 42 is configured to compare the reference voltage VREF and the data DATA<1:4> for the respective levels of the reference voltage VREF and generate internal data IDATA<1:4>. The internal data generation unit 42 may be realized by a plurality of comparators which compare the reference voltage VREF with respective bits of the data DATA<1:4> and output the internal data IDATA<1:4>. If the level of the reference voltage VREF is within a level range allowing a normal operation, the internal data IDATA<1:4> generated by the internal data generation unit 42 are generated to be the same as the data DATA<1:4>.

The command decoder 43 is configured to generate a write signal WT which is asserted when an asserted write command WT_CMD is inputted and generate an asserted read signal RD which is enabled when an asserted read command RD_CMD is inputted.

The storage unit 44 is configured to sequentially store the internal data IDATA<1:4> to the first to fourth storage sections 441 to 444 in response to the combinations of the code signals CODE<1:2> when the write signal WT is enabled. In detail, the internal data IDATA<1:4> generated when the reference voltage VREF has the first level are stored in the first storage section 441, the internal data IDATA<1:4> generated when the reference voltage VREF has the second level are stored in the second storage section 442, the internal data IDATA<1:4> generated when the reference voltage VREF has the third level are stored in the third storage section 443, and the internal data IDATA<1:4> generated when the reference voltage VREF has the fourth level are stored in the fourth storage section 444.

When the read signal RD is enabled, the storage unit 44 outputs the data stored in the first storage section 441 as first storage data SD1<1:4>, the data stored in the second storage section 442 as second storage data SD2<1:4>, the data stored in the third storage section 443 as third storage data SD3<1:4>, and the data stored in the fourth storage section 444 as fourth storage data SD4<1:4>. The first storage section 441, the second storage section 442, the third storage section 443 and the fourth storage section 444 may be realized by storage circuits such as memory cells or registers generally known in the art.

The data output unit 45 is configured to compress the first storage data SD1<1:4>, the second storage data SD2<1:4>, the third storage data SD3<1:4>, and the fourth storage data SD4<1:4>, and generate the output data DOUT<1:4>. The respective bits included in the output data DOUT<1:4> outputted from the data output unit 45 include information as to whether the levels of the reference voltage VREF set by the combinations of the code signals CODE<1:2> are within the level range allowing the normal operation. For example, the output data DOUT<1> is generated as a logic high level when the first storage data SD1<1:4> have the same level as the data DATA<1:4>, meaning that the first level of the reference voltage VREF is within the level range allowing the normal operation.

Figure 9:
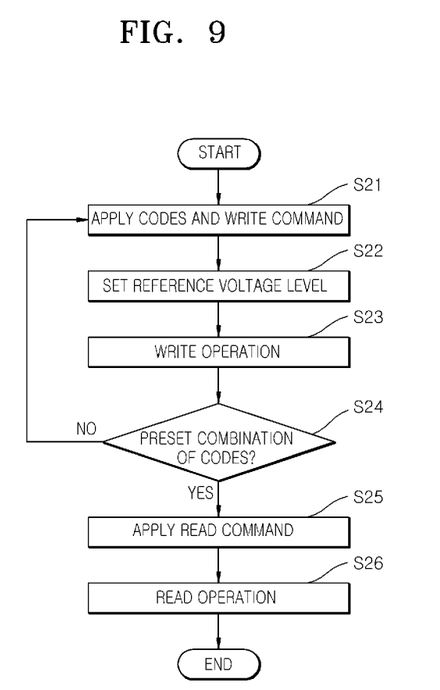
FIGS. 9 and 10 are flow charts explaining reference voltage training processes conducted by the semiconductor system shown in FIG. 7.
Figure 10:
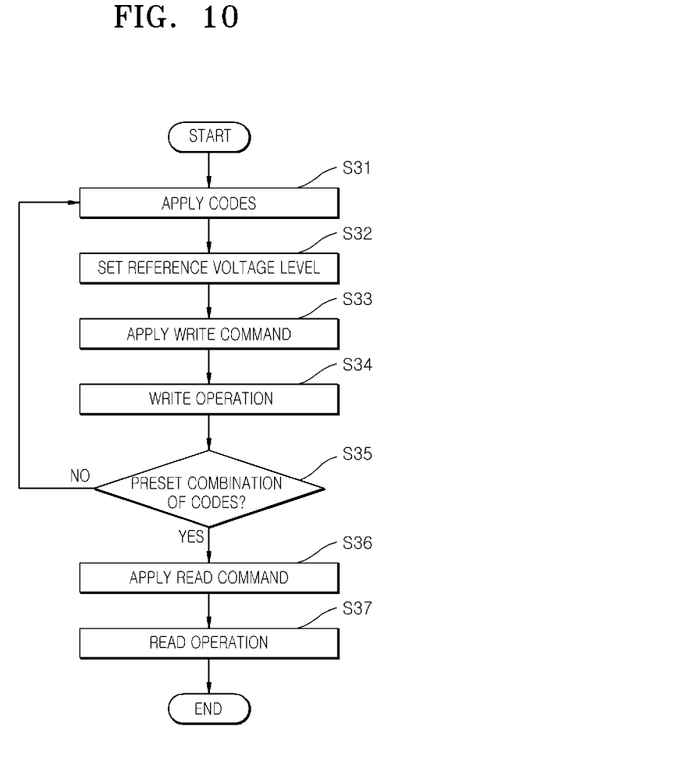

A reference voltage training operation conducted in the semiconductor system configured as mentioned above will be described in a case in which the code signals CODE<1:2> and an asserted write command WT_CMD are simultaneously applied as shown in FIG. 9 and in a case in which an asserted write command WT_CMD is applied after the code signals CODE<1:2> are applied as shown in FIG. 10.

First, the reference voltage training operation in the case where the code signals CODE<1:2> and the asserted write command WT_CMD are simultaneously applied will be described with reference to FIG. 9.

As the code signals CODE<1:2> initialized to the combination of '00' and the asserted write command WT_CMD are applied from the controller 3 (S21), the semiconductor device 4 sets the reference voltage VREF to the first level (S22). The semiconductor device 4 may perform the write operation by storing the internal data IDATA<1:4> generated by the reference voltage VREF with the first level to the first storage section 241 (S23).

Next, since the code signals CODE<1:2> do not have the combination of '11' (S24), the controller 3 increments the code signals CODE<1:2> by one to generate the combination of '01' and applies the resultant code signals CODE<1:2> to the semiconductor device 4, and the steps S21 to S24 described above are repeated. Accordingly, through these steps, the internal data IDATA<1:4> generated by the reference voltage VREF of the second level are stored in the second storage section 442, the internal data IDATA<1:4> generated by the reference voltage VREF of the third level are stored in the third storage section 443, and the internal data IDATA<1:4> generated by the reference voltage VREF of the fourth level are stored in the fourth storage section 444.

When the code signals CODE<1:2> have the preset combination of '11', the semiconductor device 4 is applied with the asserted read command RD_CMD from the controller 3 (S25). The semiconductor device 4 asserts the read signal RD and performs the read operation (S26). The data stored in the first to fourth storage sections 441 to 444 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 3 receives the output data DOUT<1:4>, checks the level range of the reference voltage VREF allowing the normal operation, and sets the level of the reference voltage VREF. In other words, in the case where only the output data DOUT<1> among the output data DOUT<1:4> has a logic low level, the levels of the reference voltage VREF allowing the normal operation become the second level, the third level, and the fourth level. Thus, the controller 3 sets the level of the reference voltage VREF to one of the second level, the third level, and the fourth level.

Second, the reference voltage training operation in the case where the asserted write command WT_CMD is applied after the code signals CODE<1:2> are applied will be described with reference to FIG. 10.

As the code signals CODE<1:2> initialized to the combination of '00' are applied from the controller 3 (S31), the semiconductor device 4 sets the reference voltage VREF to the first level (S32). When an asserted write command WT_CMD is applied from the controller 3 (S33), the semiconductor device 4 performs the write operation by storing the internal data IDATA<1:4> generated by the reference voltage VREF with the first level to the first storage section 241 (S34).

Next, since the code signals CODE<1:2> do not have the combination of '11' (S35), the controller 3 increments the code signals CODE<1:2> by one to generate the combination of '01' and applies the resultant code signals CODE<1:2> to the semiconductor device 4, and the steps S31 to S35 described above are repeated. Accordingly, through these steps, the internal data IDATA<1:4> generated by the reference voltage VREF of the second level are stored in the second storage section 442, the internal data IDATA<1:4> generated by the reference voltage VREF of the third level are stored in the third storage section 443, and the internal data IDATA<1:4> generated by the reference voltage VREF of the fourth level are stored in the fourth storage section 444.

When the code signals CODE<1:2> have the combination of '11', the semiconductor device 4 is applied with an asserted read command RD_CMD from the controller 3 (S36), asserts the read signal RD, and performs the read operation (S37). The data stored in the first to fourth storage sections 441 to 444 are outputted as the first to fourth storage data SD1<1:4> to SD4<1:4>, and the first to fourth storage data SD1<1:4> to SD4<1:4> are compressed and outputted as the output data DOUT<1:4>.

Finally, the controller 3 receives the output data DOUT<1:4>, checks the level range of the reference voltage VREF allowing the normal operation, and sets the level of the reference voltage VREF. In other words, in the case where only the output data DOUT<4> among the output data DOUT<1:4> has a logic low level, the levels of the reference voltage VREF allowing the normal operation become the first level, the second level, and the third level. Thus, the controller 3 sets the level of the reference voltage VREF to one of the first level, the second level, and the third level.

As is apparent from the above descriptions, according to the embodiments of the present invention, reference voltage training is conducted in such a manner that, after storing all the data inputted in response to reference voltages set for respective combinations of code signals, the stored data are simultaneously outputted through one read operation, whereby a time required for reference voltage training can be shortened and current consumption can be reduced.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A semiconductor system comprising:
   a controller configured to apply code signals for setting levels of a reference voltage and data, and receive output data; and
   a semiconductor device configured to receive the data for the respective levels of the reference voltage set according to the code signals, to store the data as internal data, and to output the stored internal data as the output data.

2. The semiconductor system according to claim 1, wherein the controller applies the code signals to the semiconductor device by incrementing the code signals until the code signals become a predetermined combination, and receives the output data when the code signals reach the predetermined combination.

3. The semiconductor system according to claim 1, wherein, when the code signals are not the predetermined combination, the semiconductor device receives the data in response to the reference voltage and stores the data as the internal data, and when the code signals are the predetermined combination, the semiconductor device receives the data, stores the data as the internal data, compresses stored internal data, and outputs the output data.

4. The semiconductor system according to claim 1, wherein the semiconductor device comprises:
   a reference voltage generation unit configured to generate various voltages for the reference voltage in response various combinations of the code signals;
   an internal data generation unit configured to receive the data and the reference voltage and generate the internal data;
   a control signal generation unit configured to generate an asserted write signal when the code signals are not the predetermined combination, and generate an asserted read signal after generating an asserted write signal when the code signals are the predetermined combination; and
   a storage unit configured to store the internal data in response to the write signal.

5. The semiconductor system according to claim 4, wherein the storage unit comprises memory cells to store the internal data.

6. The semiconductor system according to claim 4, wherein the storage unit outputs the stored internal data as storage data in response to the read signal.

7. The semiconductor system according to claim 6, wherein the semiconductor device further comprises:
   a data output unit configured to compress the storage data and output the compressed data as the output data.

8. A semiconductor system comprising:
   a controller configured to apply code signals for setting levels of a reference voltage, data, a read command and a write command, and receive output data; and
   a semiconductor device configured to receive, in response to the write command, the data for the respective levels of the reference voltage set according to the code signals, store the data as internal data, and output stored internal data as the output data in response to the read command.

9. The semiconductor system according to claim 8, wherein the controller applies the code signals to the semiconductor device by incrementing the code signals until the code signals become a predetermined combination, and receives the output data from the semiconductor device as a result of the code signals reaching the predetermined combination.

10. The semiconductor system according to claim 8, wherein the semiconductor device comprises:
    a reference voltage generation unit configured to generate the reference voltage which has a level set in response to the code signals;
    an internal data generation unit configured to receive the data and the reference voltage and generate the internal data;
    a control signal generation unit configured to assert a write signal when the write commanded is inputted; and
    a storage unit configured to store the internal data in response to the write signal.

11. The semiconductor system according to claim 10, wherein the control signal generation unit is configured to assert a read signal when the read command is inputted.

12. The semiconductor system according to claim 10, wherein the storage unit outputs the stored internal data as storage data in response to the read signal.

13. The semiconductor system according to claim 12, wherein the semiconductor device further comprises:
    a data output unit configured to compress the storage data and output the compressed data as the output data.

14. A semiconductor device comprising:
    a reference voltage generation unit configured to generate a reference voltage with a first level in response to code signals with a first combination, and generate the reference voltage with a second level in response to code signals with a second combination;
    an internal data generation unit configured to receive data and the reference voltage and generate internal data;
    a control signal generation unit configured to assert a write signal when the code signals are the first combination, and sequentially assert the write signal and a read signal when the code signals are the second combination; and
    a storage unit configured to store the internal data in response to the write signal.

15. The semiconductor device according to claim 14, wherein the storage unit comprises:
    a first storage section configured to store the internal data generated when the reference voltage has the first level; and
    a second storage section configured to store the internal data generated when the reference voltage has the second level.

16. The semiconductor device according to claim 15, wherein the first and second storage sections comprise memory cells to store the internal data.

17. The semiconductor device according to claim 15, wherein the storage unit outputs data stored in the first storage section as first storage data and outputs data stored in the second storage section as second storage data when the read signal is asserted.

18. The semiconductor device according to claim 17, further comprising:
a data output unit configured to compress the first and second storage data and output the compressed data as output data.

19. The semiconductor device according to claim 18, wherein the output data comprises 2 bits, with one bit of the output data includes information as to whether the first storage data have the same combination as the data, and the other bit of the output data includes information as to whether the second storage data have the same combination as the data.

20. A semiconductor device comprising:
a reference voltage generation unit configured to generate a reference voltage with a first level in response to code signals with a first combination, and generate the reference voltage with a second level in response to code signals with a second combination;
an internal data generation unit configured to receive data and the reference voltage and generate internal data;
a control signal generation unit configured to assert a write signal when an asserted write command is inputted; and
a storage unit configured to store the internal data in response to the write signal.

21. The semiconductor device according to claim 20, wherein the storage unit comprises:
a first storage section configured to store the internal data generated in the internal data generation unit when the reference voltage has the first level; and
a second storage section configured to store the internal data generated in the internal data generation unit when the reference voltage has the second level.

22. The semiconductor device according to claim 21, wherein the control signal generation unit asserts a read signal when a read command is inputted.

23. The semiconductor device according to claim 22, wherein the storage unit outputs data stored in the first storage section as first storage data and outputs data stored in the second storage section as second storage data when the read signal is enabled.

24. The semiconductor device according to claim 23, further comprising:
a data output unit configured to compress the first and second storage data and output the compressed data as output data.

25. The semiconductor device according to claim 24, wherein the output data comprises 2 bits, one bit of the output data includes information as to whether the first storage data has the same combination as the data, and the other bit of the output data includes information as to whether the second storage data has the same combination as the data.

* * * * *